United States Patent
Seroussi et al.

[11] Patent Number: 5,243,341
[45] Date of Patent: Sep. 7, 1993

[54] LEMPEL-ZIV COMPRESSION SCHEME WITH ENHANCED ADAPATION

[75] Inventors: Gadiel Seroussi, Cupertino, Calif.; Abraham Lempel, Haifa, Israel

[73] Assignee: Hewlett Packard Company, Palo Alto, Calif.

[21] Appl. No.: 892,546

[22] Filed: Jun. 1, 1992

[51] Int. Cl.$^5$ .................. H03M 7/30; H03M 7/42
[52] U.S. Cl. ........................... 341/51; 341/106; 341/87
[58] Field of Search ............ 341/51, 50, 67, 106, 341/87; 235/310, 311

[56] References Cited

U.S. PATENT DOCUMENTS

| | | |
|---|---|---|
| 4,464,650 | 8/1984 | Eastman et al. |
| 4,558,302 | 12/1985 | Welch |
| 4,814,746 | 3/1989 | Miller et al. |
| 4,847,619 | 7/1989 | Kato et al. |
| 4,876,541 | 10/1989 | Storer ................................. 341/51 |
| 4,881,075 | 11/1989 | Weng ............................. 341/51 X |
| 5,003,307 | 3/1991 | Whiting et al. |
| 5,016,009 | 5/1991 | Whiting et al. |
| 5,023,610 | 6/1991 | Rubow et al. .......................... 341/51 |

OTHER PUBLICATIONS

Product Specification AHA3101, Data Compression Coprocessor IC, Advanced Hardware Architectures, Inc., Moscow, Id.

*Primary Examiner*—Sharon D. Logan

[57] ABSTRACT

A class of lossless data compression algorithms use a memory-based dictionary of finite size to facilitate the compression and decompression of data. When the current dictionary (CD) fills up with encoded character strings, it is reset thereby losing the compression information previously contained in the dictionary. To reduce the loss in data compression caused by dictionary resets, a second, standby dictionary (SD) is used to simultaneously store a subset of the encoded data entries stored in the first dictionary. The data entries in the second dictionary represent the data entries of the first dictionary that compress the greatest amount of input data. When the first dictionary is ready to be reset, the first dictionary is replaced with the second dictionary, maintaining high data compression and freeing up memory space for new encoded data strings.

16 Claims, 3 Drawing Sheets

LEMPEL-ZIV COMPRESSION SCHEME WITH ENHANCED ADAPATION

BACKGROUND OF THE INVENTION

This invention relates generally to data compression and decompression methods and apparatus, and more particularly to implementations of lossless data compression algorithms which use a dictionary to store compression and decompression information.

A major class of compression schemes encodes multiple-character strings using binary sequences or "codewords" not otherwise used to encode individual characters. The strings are composed of an "alphabet," or single-character strings. This alphabet represents the smallest unique piece of information the compressor processes. Thus, an algorithm which uses eight bits to represent its characters has 256 unique characters in its alphabet. Compression is effective to the degree that the multiple-character strings represented in the encoding scheme are encountered in a given file of data stream. By analogy with bilingual dictionaries used to translate between human languages, the device that embodies the mapping between uncompressed code and compressed code is commonly referred to as a "dictionary."

Generally, the usefulness of a dictionary-based compression scheme is dependent on the frequency with which the dictionary entries for multiple-character strings are used. If a fixed dictionary is optimized for one file type it is unlikely to be optimized for another. For example, a dictionary which includes a large number of character combinations likely to be found in newspaper text files is unlikely to compress efficiently data base files, spreadsheet files, bit-mapped graphics files, computer-aided design files, et cetera.

Adaptive compression schemes are known in which the dictionary used to compress given input data is developed while that input data is being compressed. Codewords representing every single character possible in the uncompressed input data are put into the dictionary. Additional entries are added to the dictionary as multiple-character strings are encountered in the file. The additional dictionary entries are used to encode subsequent occurrences of the multiple-character strings. For example, matching of current input patterns is attempted only against phrases currently residing in the dictionary. After each match, a new phrase is added to the dictionary. The new phrase is formed by extending the matched phrase by one symbol (e.g., the input symbol that "breaks" the match). Compression is effected to the extent that the multiple-character strings occurring most frequently in the file are encountered as the dictionary is developing.

During decompression, the dictionary is built in a like manner. Thus, when a codeword for a character string is encountered in the compressed file, the dictionary contains the necessary information to reconstruct the corresponding character string. Widely-used compression algorithms that use a dictionary to store compression and decompression information are the first and second methods of Lempel and Ziv, called LZ1 and LZ2 respectively. These methods are disclosed in U.S. Pat. No. 4,464,650 to Eastman et al., and various improvements in the algorithms are disclosed in U.S. Pat. Nos. 4,558,302 to Welch, and 4,814,746 to Miller et al. These references further explain the use of dictionaries.

When working on a practical implementation, the amount of memory available for compression/decompression is finite. Therefore, the number of entries in the dictionary is finite and the length of the codewords used to encode the entries is bounded. Typically, the length varies between 12 and 16 bits. When the input data sequence is sufficiently long, the dictionary will eventually "fill up." Several courses of action are possible at this point. For example, the dictionary can be frozen in its current state, and used for the remainder of the input sequence. In a second approach, the dictionary is reset and a new dictionary created from scratch. In a third approach, the dictionary is frozen for some time, until the compression ratio deteriorates, then the dictionary is reset.

The first alternative has the disadvantage of losing the learning capability of the basic compression algorithm. If the statistics of the input data change, the dictionary no longer follows those changes, and a rapid deterioration in compression ratio will occur. A dictionary reset method maintains the learning capability of the algorithm, but suffers from a temporary deterioration in compression ratio when switched to an empty dictionary (e.g., all previously accumulated knowledge of the source is lost).

One method for reducing the number of required dictionary resets is to increase the dictionary memory size. Increased memory size, however, increases cost and can increase the time required to search dictionary data entries. Much research has also gone into hashing algorithms that quickly locate data in a serially accessible memory, for example, U.S. Pat. No. 4,558,302 to Welch.

Accordingly, a need remains for a way to improve the performance of dictionary-based data compression systems.

SUMMARY OF THE INVENTION

It is therefore, an object of the invention to minimize the loss in data compression created when the dictionary in a dictionary-based data compression system is reset.

Another object of the invention is to increase the adaptation properties of data compression systems for input data sequences with changing statistical characteristics.

A further object of the invention is to maximize the knowledge residing within the memory of a dictionary-based data compression system to maximize data compression.

The invention is a data compression/decompression system that simultaneously builds a current dictionary and a standby dictionary. The current dictionary serves the same purpose as the dictionary in a standard data compression engine. The standby dictionary is built in parallel with the current dictionary, so as to contain a subset of the phrases of the current dictionary. This subset is chosen to best characterize the patterns occurring in the source data. When the current dictionary fills-up, it is replaced by the standby dictionary, and a new standby dictionary is built "from scratch." Therefore, the compressor never switches to an empty dictionary, and the deterioration in data compression caused by having a limited dictionary memory size is reduced.

The current dictionary starts with sufficient empty space to add new data entries thereby allowing continued adaptation to the source data. This feature is of paramount importance in compressing source data with varying statistics. Although some information is lost by switching to a smaller number of data entries in the standby dictionary, the time to rebuild the dictionary to maximum efficiency is still less than a complete dictionary reset. Therefore, a smaller dictionary memory can be used with less negative impact on the data compression ratio. In addition, a smaller dictionary allows more effective use of search algorithms (e.g., hashing algorithms) thereby further reducing data compression time.

The criteria for selecting the subset of the current dictionary that goes into the standby dictionary can vary depending upon the specific application. For example, an encoded data string is copied to the standby dictionary if it has been matched at least once with a data entry in the current dictionary. Alternatively, the entries in the standby dictionary can be selected according to string length, most recent data entry matches, or any criterion that identifies entries that maximize compression.

In addition, the criteria for switching (resetting) from the current to standby dictionary can be changed depending on the type of data or application. For example, the current dictionary can be reset when it is filled with valid data entries. In the alternative, the current dictionary can be reset when it falls below a predetermined performance threshold, as described in U.S. Pat. No. 4,847,619 to Kato et al. In a second application of the standby dictionary, mainly in situations where the data characteristics are stationary, the compressor makes two passes at the data. In the first pass, the compressor scans a large sample of the data. The sample is large enough to cause the current dictionary to fill up many times thereby causing the standby dictionary to replace the current dictionary a proportional number of times. At each dictionary switch, the current dictionary is "refined" until, after several iterations, the algorithm has built a dictionary strongly customized to the data sample. The customized dictionary is then set as the sole dictionary reference used by the compression engine during a second pass to compress the input data. The customized dictionary thereby performs significantly better than a single dynamic dictionary for the same data.

The foregoing and other objects, features and advantages of the invention will become more readily apparent from the following detailed description of a preferred embodiment which proceeds with reference to the drawings.

DETAILED DESCRIPTION

Figure 1:
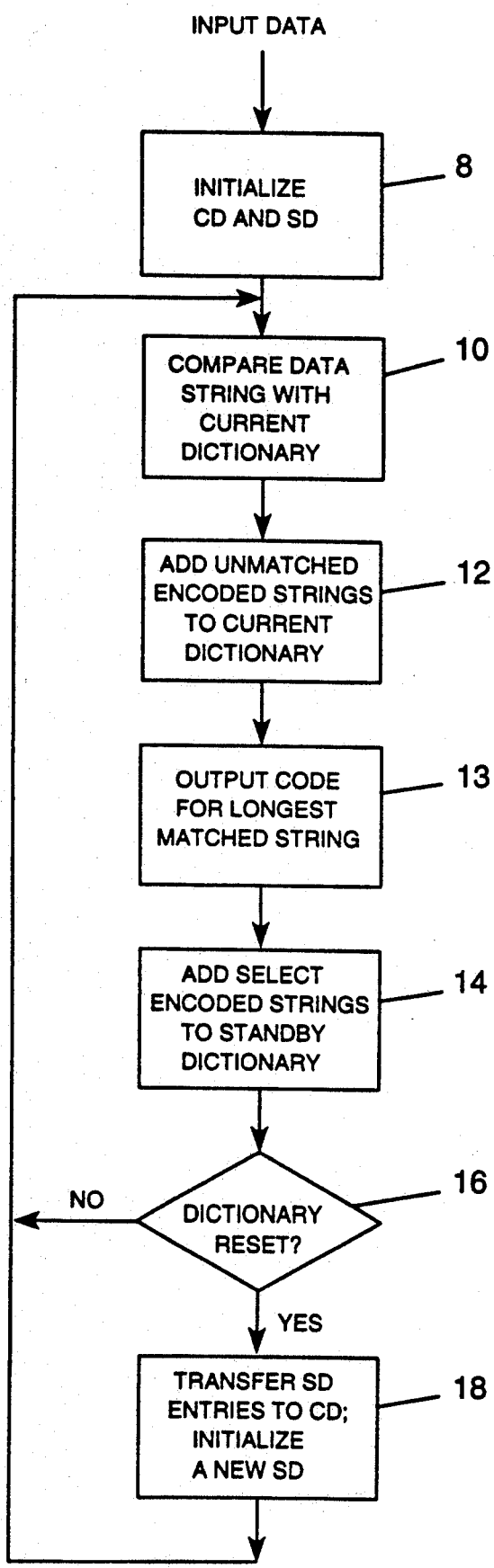
FIG. 1 is a data flow diagram for a data compression system with current and standby dictionaries embodying the present invention.

FIG. 1 is a data flow diagram for a data compression/decompression system with current and standby dictionaries. The method illustrated in FIG. 1 begins at block 8 with initialization of both the current dictionary (CD) and the standby dictionary (SD). For example, codewords representing every single character possible in the uncompressed input data are put into the dictionaries. Alternatively, the initial dictionaries could be empty. The encoding of character strings from the data sequence is implemented using any desired encoding scheme.

In block 10, input data is compared with previously encoded data entries of a current dictionary to determine whether the character string and any of the dictionary data entries match. Block 12 stores an unmatched character string as a new encoded data entry in the current dictionary. When a match can no longer be extended, the code for the longest matched string is output at block 13.

Block 14 stores a subset of the previously encoded data entries of the current dictionary (CD) in the standby dictionary (SD). The subset selection process in block 14, as stated above, is alterable for specific input data to produce the highest compression ratio with a given number of data entries in the standby dictionary. For example, data entries for the standby dictionary can be selected based on the number of times an input character string matches a data entry within the dictionary. Alternatively, the standby dictionary subset can be selected according to the number of input characters represented by the encoded character string. In general, any preference scheme can be applied at this stage.

Decision block 16 determines if a dictionary reset is required. For example, a reset is required when the current dictionary reaches a predetermined number of encoded character string entries or when the compression ratio has fallen below a given performance threshold. If the current dictionary does not need to be reset, the compression engine reads a new character string and the process returns to block 10. If the current dictionary is reset, block 18 then replaces the current dictionary with the entries in the standby dictionary, initializes a new standby dictionary, reads a new character string and then returns to block 10.

A dictionary based compression/decompression method according to FIG. 1 can be used to generate a static customized current dictionary that is used to compress data. For example, a data sample of the input data sequence is selected. The current dictionary is then customized by repeatedly replacing the current dictionary with the standby dictionary. The customized current dictionary is then locked in a read-only function and used by the compression engine exclusively for compression or decompression of the data sequence.

Figure 2:
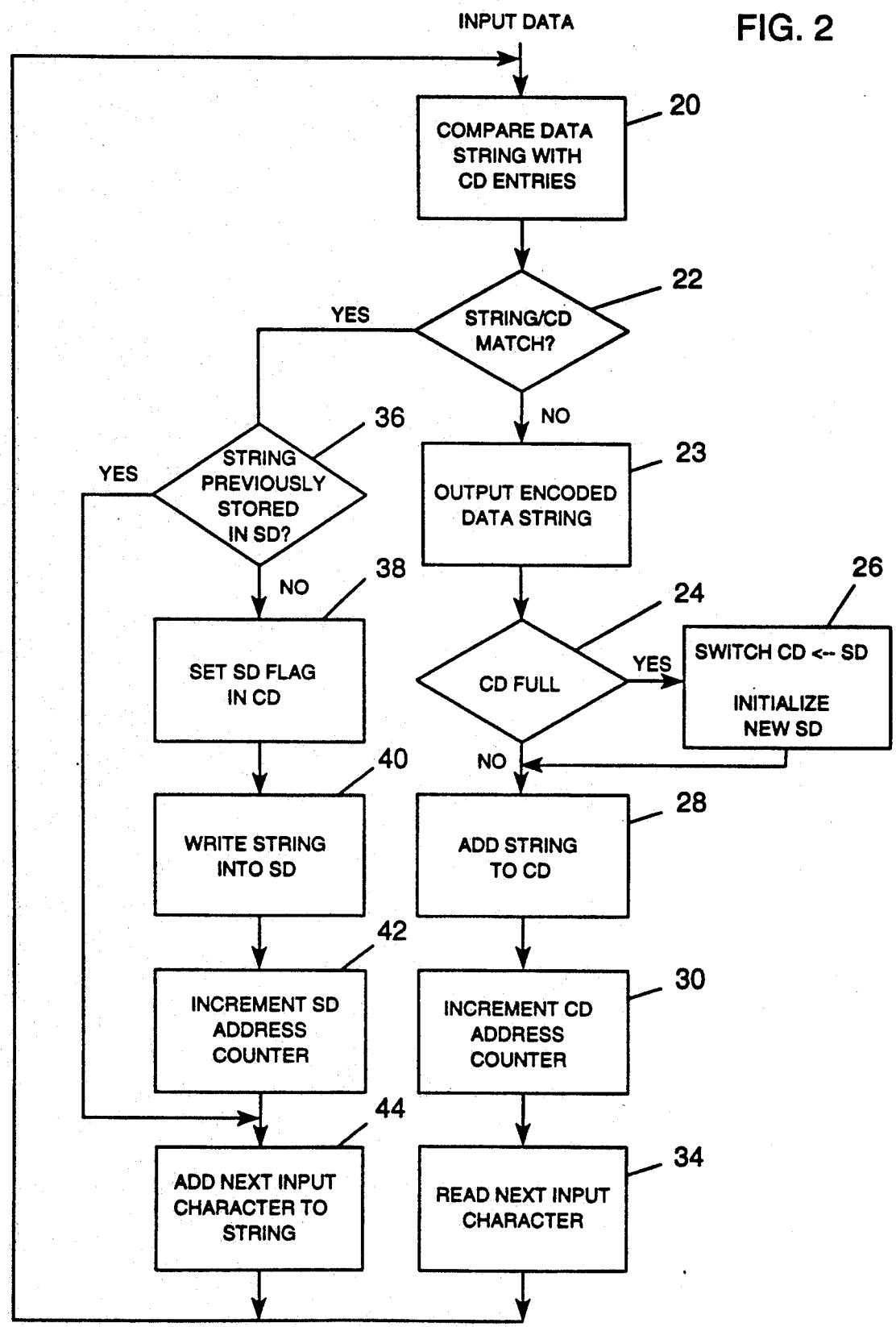
FIG. 2 is a detailed data flow diagram illustrating one example for the standby dictionary data selection process of FIG. 1.

FIG. 2 is a detailed data flow diagram illustrating one example of a data compression algorithm that utilizes a current and standby dictionary. FIG. 2 illustrates a method wherein a data string is copied into the standby dictionary when the input data string matches an entry in the current dictionary. This procedure assures that the data string has been "seen" at least twice in the input. The current and standby dictionary are switched when the current dictionary is full (e.g., reached a predetermined number of valid data entries). As mentioned above, alternative dictionary switching criteria and standby dictionary data entry selection criteria are easily implemented according to specific application requirements.

An input data string is compared with data entries of the current dictionary in block 20. Decision block 22 branches to blocks 23 and 24 if there is no match between the input data and the entries in the current dictionary. The longest matched data string is then encoded and output at block 23.

Decision block 24 determines if the current dictionary is full. If the current dictionary is not full, block 28 stores the data string as a data entry in the current dictionary. If the current dictionary is full, block 26 switches the current dictionary with the standby dictionary. The data string is then stored in the new current directory. Since the current dictionary is now replaced with a smaller subset of data entries, (e.g. data entries of the standby dictionary) there is now space available to store new data strings. Block 30 increments the address counter of the current dictionary. A new input character is read from the input data in block 34, then the compare process in block 20 is repeated.

When decision block 22 determines there is a match between the input data and an entry in the current dictionary, decision block 36 checks to determine if the data string has previously been stored into the standby directory. If the data string has not been previously copied into the standby dictionary, a flag is set in a status field within the current dictionary. The flag is associated with the current dictionary data entry that matched the data string. The flag indicates to the compression engine that the data entry has previously been copied into the standby directory. This prevents multiple copying of the same data entry into the standby dictionary. Block 40 writes the data string into the standby directory and block 42 increments the standby directory address counter. Since the data string did match with a data entry in the current dictionary, block 44 adds the next input character to the present data string and returns to block 20. If decision block 36 indicates that the data string has previously been stored in the standby dictionary, the process goes directly to block 44 and continues as described above.

Figure 3:
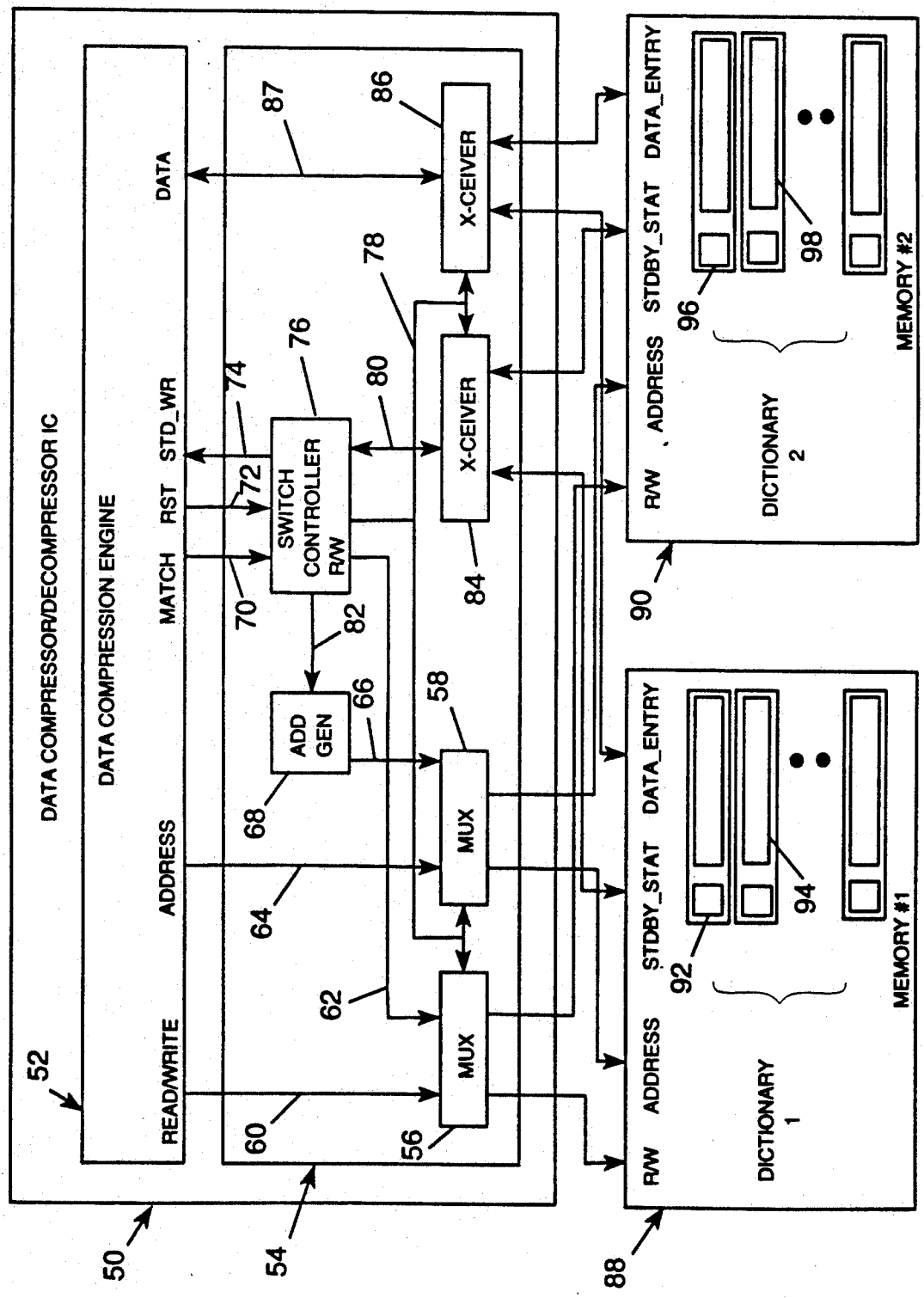
FIG. 3 is a block diagram of an example of a data compression hardware system with current and standby dictionaries embodying the method and apparatus of the present invention.

FIG. 3 shows an example implementation of the invention in a data compressor/decompressor integrated circuit (IC) 50 which is a presently preferred embodiment. The data compressor/decompressor (DCD) IC 50 includes a data compression/decompression engine 52 in combination with a data compressor interface circuit 54. The DCD IC 50 is used in combination with dictionary 1 (D1) comprised within random access memory (RAM) 88 and dictionary 2 (D2) comprised within RAM 90. The circuitry shown herein is conveniently implemented in a single IC or as separate ICs 50, 88, and 90. D1 and D2 are illustrated as RAMs but can be conveniently implemented in content addressable memory or any alternative memory structure. The RAM is conventional. Each RAM dictionary memory location in D1 and D2 includes a data entry field (data__entry) 94 and 98, respectively, and a standby status field (stdby__stat) 92 and 96, respectively.

The data entry field stores unique data strings occurring in the input data sequence. The standby status field includes a standby dictionary status flag that indicates whether the data entry in the current dictionary has previously been stored in the standby dictionary. The standby status field can conveniently include a dict__ valid field for identifying valid data entries. The use of a multi-bit dict__valid field in a data compression system is described in commonly assigned U.S. patent application entitled, DICTIONARY RESET PERFORMANCE ENHANCEMENT FOR DATA COMPRESSION APPLICATIONS, Ser. No. 07/766,475, filing date Sep. 25, 1991, and is incorporated by reference.

The data compression engine 52 is preferably designed to implement the LZ2 or LZ1 compression algorithm, but can be designed to implement any suitable dictionary-based compression scheme. Also, if desired, the compression engine may incorporate or be used in conjunction with additional means for controlling dictionary reset, such as disclosed in U.S. Pat. No. 4,847,619. Being otherwise conventional, the particular algorithm and architecture of the data compression engine need not be further described.

The data compressor interface circuit 54 comprises two main subcircuits. A switch controller subcircuit 76 monitors dictionary reset request signals 72 and data string match signals 70 which are output from the data compression engine 52 or from other circuitry associated with the data compressor/decompressor IC. Subcircuit 76 controls which RAM operates as the current dictionary and standby dictionary. This subcircuit reads the stdby__stat field from the current dictionary to determine if the present encoded data entry has previously been copied into the standby dictionary.

Address generator circuit 68 sequences through the binary values of the data__entry field for the dictionary operating in the standby mode. A typical implementation of this subcircuit is a binary counter but other forms of sequencer can be readily used. Associated with the subcircuits are multiplexers 56 and 58 and transceivers 84 and 86. Multiplexer 56 selects between read/write signals 60 and 62, respectively, from the data compression engine 52 and the switch controller circuit 76. Multiplexer 58 selects between address signals 64 and 66, respectively, from the data compression engine 52 and address generator 68. Transceiver 86 operates as a bus controller selecting between either data__entry field 94 or 98 to connect to data bus 87 connected to data compression engine 52. Transceiver 84 selects between stdby__stat fields 92 or 96 for connecting to switch controller 76. The multiplexers and transceivers are controlled by control signal 78 and address generator 68 is controlled by control signal 82. Both control signals are from the switch controller circuit 76.

DCD IC 50 permits conventional data transfer between one of the dictionaries (current dictionary) and the data compression engine 52 during normal compression/decompression operations. The system also allows the standby dictionary to receive data from data compression engine 52 or directly from the current dictionary to create the data entry subset in accordance with the invention.

OPERATION

Switch controller 76 selects between D1 and D2 as the current dictionary, for example D1. The compression engine then begins performing a data compression, reading and writing encoded data to the data__entry field 94 of D1. When the compression algorithm determines that an encoded data string is a candidate for writing into the standby dictionary (D2), for example, when an encoded data string matches a data entry within the current dictionary (D1), match signal 70 is activated. Switch controller 76 thereby checks the stdby__stat field 92 from the current dictionary to determine if the data entry has previously been copied into the standby dictionary. If not, the data string is written into the dict__entry field 98 of D2, at the location provided by address generator 68. In addition, the stdby__stat field 92 in the current dictionary is "set" by switch controller 76, to prevent the same encoded data string from being copied into the standby dictionary twice.

When data compression engine 52 activates reset signal 72, switch controller 76 alters the value of control signal 78. The new control signal changes the connections for the multiplexers and transceivers so that D2 is now operating as the current dictionary and D1 is now operating as the standby dictionary. The subset of data entries loaded into D2 is then used as the initial set of data entries for compression engine 52. Thus, when the data compression engine illustrated in FIG. 3 is reset, the dict_entry field of the new dictionary contains a high compression ratio subset of the previously encoded input data.

Switch controller 76 can be shut off by the data compression engine by activating a specific combination of match signal 70 and reset signal 72. This allows the data compression engine to read/write encoded data exclusively to/from a single dictionary. This is used for the customized data dictionary operation described above and for compatibility with single-dictionary schemes.

The above-described method has proven to be advantageous. For example, 550 files containing user operating manuals were compressed using the standard UNIX "compress" command (a traditional implementation of LZ2). Then, a customized dictionary was built using the above-described current/standby dictionary method and the files were then compressed using the customized dictionary created from the data sample. The results are summarized below:

Original file size: 6,602,300 bytes
Unix compress: 2,781,686 bytes
Customized dictionary: 2,025,742 bytes
Compression improvement: 37%

Therefore, the customized dictionary provides a substantial compression improvement over prior compression methods.

Having described and illustrated the principles of the invention in a preferred embodiment thereof, it should be apparent that the invention can be modified in arrangement and detail without departing from such principles. For example, it is possible to implement the current and standby dictionaries both on the same RAM by having a field that indicates whether the entry is in the standby dictionary or not. Upon reset, all non-standby dictionary entries are cleared. The address generation circuitry is more complicated since, after reset, entries are not in consecutive locations. This approach is well-suited for a content addressable memory (CAM) implementation. We claim all modifications and variation coming within the spirit and scope of the following claims.

We claim:

1. A dictionary based data compression/decompression system comprising:
   a memory device including first and second dictionaries, each dictionary including a finite number of locations for storing data from a data sequence;
   a data compression engine for reading and writing to a first dictionary in accordance with a predetermined compression algorithm;
   the data compression engine including means for compressing/decompressing input data to produce encoded data strings, and means for reading/writing data entries from/into locations within the first dictionary; and
   logic means for writing into the second dictionary a selected subset of the data entries written into the first dictionary by the data compression engine while writing data entries into the first dictionary.

2. A dictionary based data compression/decompression system according to claim 1 including means for switching the read/write operations of the data compression engine between the first and second dictionaries so that the data compression engine transfers stored data to/from the second dictionary in accordance with the predetermined compression algorithm and the logic means writes a subset of the data entries into the first dictionary.

3. A data-compression/decompression system according to claim 2 further comprising reset means for activating the switching means when the first dictionary is loaded with a predetermined number of data entries.

4. A dictionary based data compression/decompression system comprising:
   a memory device including first and second dictionaries, each dictionary including a finite number of locations for storing data from a data sequence;
   a data compression engine for reading and writing to a first dictionary in accordance with a predetermined compression algorithm;
   the data compression engine including means for compressing/decompressing input data to produce encoded data strings, and means for reading/writing data entries from/into locations within the first dictionary;
   logic means for writing into the second dictionary selected subset of the data entries written into the first dictionary by the data compression engine;
   means for switching the read/write operations of the data compression engine between the first and second dictionaries so that the data compression engine transfers stored data to/from the second dictionary in accordance with the predetermined compression algorithm and the logic means writes a subset of the data entries into the first dictionary; and
   reset means for activating the switching means when the data compression engine falls below a predetermined compression threshold ratio.

5. A data-compression/decompression system according to claim 2 including means for deactivating the switching means so that the data compression engine reads/writes stored data exclusively to/form a single dictionary.

6. A dictionary based data compression/decompression system comprising:
   a memory device including first and second dictionaries, each dictionary including a finite number of locations for storing data from a data sequence;
   a data compression engine for reading and writing to a first dictionary in accordance with a predetermined compression algorithm;
   the data compression engine including means for compressing/decompressing input data to produce encoded data strings, and means for reading/writing data entries from/into locations within the first dictionary;
   logic means for writing into the second dictionary a selected subset of the data entries written into the first dictionary by the data compression engine; and
   means for identifying data entries in the first dictionary previously written into the second dictionary.

7. A dictionary based data compression/decompression system comprising:

a memory device including first and second dictionaries, each dictionary including a finite number of locations for storing data from a data sequence;

a data compression engine for reading and writing to a first dictionary in accordance with a predetermined compression algorithm;

the data compression engine including means for compressing/decompressing input data to produce encoded data strings, and means for reading/writing data entries from/into locations within the first dictionary; and logic means for writing into the second dictionary a selected subset of the data entries written into the first dictionary by the data compression engine;

the logic means being operable to write a data entry into the second dictionary that has matched at least once with one of the data entries of the first dictionary while writing data entries into the first dictionary.

8. A dictionary based data-compression/decompression system comprising:

a memory including a current and standby dictionary for storing data entries, each data entry defining a plurality of data sequences;

a data compression engine for selecting character strings from a data sequence and comparing the character strings to data entries in the current dictionary to determine whether the character string and any of the data entries match;

means for storing unmatched multi-character strings as data entries in the current dictionary;

means for writing a selected subset of the data entries of the multi-character strings previously stored in the current dictionary into the standby dictionary while writing data entries into the current dictionary; and means for switching the current dictionary with the standby dictionary and initializing the standby dictionary when the data compression engine detects a predetermined reset condition.

9. A dictionary-based data compression/decompression method in which a predetermined compression algorithm reads/writes data in a dictionary to compress/decompress a data sequence, the method comprising:

establishing a current dictionary and a standby dictionary for storing data derived from the data sequence;

inputting a character string from the data sequence;

comparing the input character string to previously stored data entries in the current dictionary to determine whether the input character string and any of the stored data entries match;

storing an unmatched input character string as a data entry in the current dictionary;

storing a subset of the previously stored data entries of the current dictionary in the standby dictionary while writing data entries into the current dictionary; and replacing the current dictionary with the standby dictionary and initializing a new standby dictionary when a predetermined reset condition occurs.

10. A dictionary based compression/decompression method in which a predetermined compression algorithm reads/writes data in a dictionary to compress/decompress a data sequence, the method comprising;

establishing a current dictionary and a standby dictionary for storing data derived from the data sequence;

inputting a character string from the data sequence;

comparing the input character string to previously stored data entries in the current dictionary to determine whether the input character string and any of the stored data entries match;

storing an unmatched input character string as a data entry in the current dictionary;

storing a subset of the previously stored data entries of the current dictionary in the standby dictionary;

selecting the subset of the previously stored data entries to be stored in the standby dictionary to comprise stored data entries from the current dictionary that have matched at least once with a subsequently encoded character string; and replacing the current dictionary with the standby dictionary and initializing a new standby dictionary when a predetermined reset condition occurs.

11. A dictionary based compression/decompression method in which a predetermined compression algorithm reads/writes data in a dictionary to compress/decompress a data sequence, the method comprising;

establishing a current dictionary and a standby dictionary for storing data derived from the data sequence;

inputting a character string from the data sequence;

comparing the input character string to previously stored data entries in the current dictionary to determine whether the input character string and any of the stored data entries match;

storing an unmatched input character string as a data entry in the current dictionary;

storing a subset of the previously stored data entries of the current dictionary in the standby dictionary;

selecting the subset of data entries to be stored in the standby dictionary so as to generate, when utilized by the compression algorithm, at least as great an input data compression ratio as any other subset of the current dictionary with the same number of encoded data entries; and replacing the current dictionary with the standby dictionary and initializing a new standby dictionary when a predetermined reset condition occurs.

12. A dictionary based compression/decompression method in which a predetermined compression algorithm reads/writes data in a dictionary to compress/decompress a data sequence, the method comprising:

establishing a current dictionary and a standby dictionary for storing data derived from the data sequence;

inputting a character string from the data sequence;

comparing the input character string to previously stored data entries in the current dictionary to determine whether the input character string and any of the stored data entries match;

storing an unmatched input character string as a data entry in the current dictionary;

storing a subset of the previously stored data entries of the current dictionary in the standby dictionary;

replacing the current dictionary with the standby dictionary and initializing a new standby dictionary when a predetermined reset condition occurs;

selecting a data sample of an input data sequence;

building the current and standby directories based on the selected data sample; and disabling the standby dictionary after the current dictionary has been replaced with the standby dictionary built using the data sample.

13. A dictionary based compression/decompression method according to claim 12 including freezing the current dictionary's data entries and sending the current dictionary's data entries to a decoder.

14. A dictionary based compression/decompression method according to claim 12 including intermittently resetting the dictionaries prior to disabling the standby dictionary.

15. A dictionary based compression/decompression method in which a predetermined compression algorithm reads/writes data in a dictionary to compress/decompress a data sequence, the method comprising:

establishing a current dictionary and a standby dictionary for storing data derived from the data sequence;

inputting a character string from the data sequence;

comparing the input character string to previously stored data entries in the current dictionary to determine whether the input character string and any of the stored data entries match;

storing an unmatched input character string as a data entry in the current dictionary;

compressing/decompressing input data to produce encoded data strings using the current dictionary;

storing a subset of the previously stored data entries of the current dictionary in the standby dictionary; and replacing the current dictionary with the standby dictionary when the current dictionary reaches a predetermined number of stored character string entries.

16. A dictionary based data compression/decompression system comprising:

a memory device including first and second dictionaries, each dictionary including a finite number of locations for storing data from a data sequence;

a data compression engine for reading and writing to a first dictionary in accordance with a predetermined compression algorithm;

the data compression engine including means for compressing/decompressing input data to produce encoded data strings, and means for reading/writing a first set of data entries from/into locations within the first dictionary; and means for transferring a selected subset of the first set of data entries from the first dictionary to the second dictionary, the second dictionary receiving the selected subset directly from the first dictionary and using the subset as an initial set of data entries that can be expanded upon with additional data entries taken from the input data.

* * * * *